(12) United States Patent
Kumakura et al.

(10) Patent No.: US 6,841,605 B1
(45) Date of Patent: Jan. 11, 2005

(54) ADHESIVE COMPOSITION FOR METAL FOIL, AND ADHESIVE-COATED METAL FOIL, METAL-CLAD LAMINATE AND RELATED MATERIALS USING THE SAME

(75) Inventors: Toshihisa Kumakura, Shimodate (JP); Takeshi Horiuchi, Tochigi (JP); Kazuyuki Magome, Shimodate (JP); Norifumi Shiraishi, Noda (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/404,715

(22) Filed: Sep. 24, 1999

(30) Foreign Application Priority Data

Sep. 24, 1998 (JP) .......................................... 10-269692

(51) Int. Cl.$^7$ ................................................ C08K 3/22
(52) U.S. Cl. ........................ 524/430; 427/386; 428/344; 523/400; 523/456; 523/466; 524/434; 524/436; 524/437; 524/451; 524/492; 524/493
(58) Field of Search ................................ 524/437, 451, 524/492, 493, 430, 434, 436, 433; 427/386; 428/344; 523/400, 456, 466

(56) References Cited

U.S. PATENT DOCUMENTS

| | | | | | |
|---|---|---|---|---|---|
| 2,760,863 | A | * | 8/1956 | Plambeck, Jr. | 430/306 |
| 3,060,023 | A | * | 10/1962 | Burg et al. | 430/254 |
| 3,261,686 | A | * | 7/1966 | Celeste et al. | 430/288.1 |
| 3,380,831 | A | * | 4/1968 | Cohen et al. | 430/288.1 |
| 3,594,410 | A | * | 7/1971 | Cohen et al. | 560/224 |
| 3,616,195 | A | | 10/1971 | Rendleman | |
| 4,194,955 | A | * | 3/1980 | Nowak et al. | 204/159.15 |
| 4,751,136 | A | * | 6/1988 | Kamiya et al. | 428/317.1 |
| 5,066,691 | A | * | 11/1991 | Kumakura et al. | 523/438 |
| 5,314,740 | A | * | 5/1994 | Ishii et al. | 428/209 |
| 5,364,703 | A | * | 11/1994 | Tracy et al. | 428/460 |
| 5,395,730 | A | * | 3/1995 | Podszun et al. | 430/203 |
| 5,674,611 | A | * | 10/1997 | Saida et al. | 428/344 |
| 5,959,256 | A | * | 9/1999 | Saida et al. | 174/258 |
| 6,010,817 | A | * | 1/2000 | Van Damme et al. | 430/200 |
| 6,165,617 | A | * | 12/2000 | Satoh et al. | 428/418 |

FOREIGN PATENT DOCUMENTS

| | | | |
|---|---|---|---|
| DE | 12 93 367 | | 4/1969 |
| EP | 0 275 070 | | 7/1988 |
| EP | 0 439 828 | | 8/1991 |
| JP | 63086780 | * | 4/1988 |
| JP | 7-258619 | | 10/1995 |

OTHER PUBLICATIONS

European Search Report dated Jan. 24, 2000 for EP 99 30 7434.

"Method for determining the comparative and the proof tracking indices of solid insulating material under moist conditions" pp 1–17. Publication 112 3$^{rd}$ edition 1979.

* cited by examiner

Primary Examiner—Judy M. Reddick
(74) Attorney, Agent, or Firm—Antonelli, Terry, Stout & Kraus, LLP

(57) ABSTRACT

Disclosed are an adhesive composition for a metal foil which comprises a material wherein a tracking resistance test is carried out according to the IEC method by making a thickness of an adhesive layer 30 to 40 μm, using a copper foil pattern with a width of 4 mm and making a distance between electrodes 0.4 mm, then the adhesive layer dissolves out for the first time when 5 drops or more of an electrolyte are dropped thereon, an adhesive-coated metal foil, a metal-clad laminate, a wiring board, a multi-layer board and a multi-layer wiring board using the same.

8 Claims, No Drawings

ADHESIVE COMPOSITION FOR METAL FOIL, AND ADHESIVE-COATED METAL FOIL, METAL-CLAD LAMINATE AND RELATED MATERIALS USING THE SAME

BACKGROUND OF THE INVENTION

1. Field of the Invention

This invention relates to an adhesive composition for a metal foil to be used for preparation of a laminated plate for a printed wiring board to be used for an electric and electronic equipment, an adhesive-coated metal foil, a metal-clad laminate, a wiring board, a multi-layer board and a multi-layer wiring board using the same.

2. Background Art

Electronic equipment for public use becomes a small size and has high functions so that a printed wiring board to be used therein is required to be high density and fine wiring pattern. Accompanying with this tendency, a copper-clad laminate to be used in a printed wiring board is required to be high density when it is actually fit. Thus, required levels of solder heat resistance or copper foil-peel resistance is becoming severer. Also, for electric equipment to which a high voltage is applied such as a television set, tracking resistance is now required to ensure safety. Tracking means a phenomenon, which forms a carbonized conducting path or a tracking path between the portions having a difference in voltage on the surface of an insulating material.

In the prior art, a copper clad laminated board has been prepared by adhering an adhesive-coated metal foil in which an adhesive layer is formed on a copper foil and a prepreg in order to improve adhesiveness between the copper foil of the copper clad laminated board and the prepreg. As the adhesive, an adhesive in which a phenol resin is formulated into a polyvinyl acetal resin has been used since it is excellent in the points of adhesiveness, solder heat resistance and copper foil peel resistance.

However, in an adhesive in which a phenol resin is formulated into a polyvinyl acetal resin, whereas solder heat resistance, etc. are excellent, but the phenol resin is easily carbonized so that the adhesive becomes easily conductive whereby it is inferior in tracking resistance.

Thus, to improve tracking resistance of an adhesive, a method of using an epoxy resin or a melamine resin has been proposed, for example, in Japanese Provisional Patent Publication No. 116682/1987.

However, only when an epoxy resin or a melamine resin is formulated into an adhesive, the tracking resistance cannot sufficiently be improved. And yet, as compared with the case where a phenol resin is formulated, reactivity or compatibility of a resin is markedly different so that heat resistance can hardly be maintained.

SUMMARY OF THE INVENTION

An object of the present invention is to provide an adhesive composition for a metal foil having excellent heat resistance and tracking resistance by solving the above problems and having good laminated board characteristics, an adhesive-coated metal foil, a metal-clad laminate, a wiring board, a multi-layer board and a multi-layer wiring board using the same.

The present invention relates to an adhesive composition for a metal foil which comprises a material wherein a tracking resistance test is carried out according to the IEC method by making a thickness of an adhesive layer 30 to 40 $\mu$m, using a copper foil pattern with a width of 4 mm and making a distance between electrodes 0.4 mm, then the adhesive layer dissolves out for the first time when 5 drops or more of an electrolyte are dropped thereon.

Moreover, the present invention relates to an adhesive composition for a metal foil, which comprises a polyvinyl acetal resin and a thermosetting resin.

The present invention also relates to an adhesive composition for a metal foil which comprises a polyvinyl acetal resin and a thermosetting resin and in a thermogravimetric analysis after curing, a 5% weight loss temperature being 290° C. or more and a carbon residual ratio at 650° C. being less than 1% by weight.

Further, the present invention relates to an adhesive composition for a metal foil which comprises thermosetting resins at least one of which does not react with a polyvinyl acetal resin and which is compatible with the polyvinyl acetal resin uniformly. Moreover, the present invention relates to an adhesive composition for a metal foil which comprises thermosetting resins at least one of which does not have an aromatic ring.

The present invention further relates to an adhesive composition for a metal foil which comprises thermosetting heat resistant resins at least one of which is at least one of a polyfunctional acrylate resin or a polyfunctional methacrylate resin having two or more acryloyl groups or methacryloyl groups in the molecule.

The present invention further relates to the above-mentioned adhesive composition for a metal foil which comprises as main components a polyvinyl acetal resin, a polyfunctional acrylate compound or a polyfunctional methacrylate compound having two or more acryloyl groups or methacryloyl groups in the molecule and an epoxy resin.

The present invention further relates to the above-mentioned adhesive composition for a metal foil which comprises 20 to 500 parts by weight of a polyfunctional acrylate compound or a polyfunctional methacrylate compound having two or more acryloyl groups or methacryloyl groups in the molecule and 5 to 100 parts by weight of an epoxy resin based on 100 parts by weight of a polyvinyl acetal resin.

Moreover, the present invention relates to the above-mentioned adhesive composition for a metal foil wherein the polyfunctional acrylate compound or the polyfunctional methacrylate compound having two or more acryloyl groups or methacryloyl groups in the molecule is at least one selected from the group consisting of pentaerythritol triacrylate, trimethylolpropane triacrylate, trimethylolpropane ethyleneoxide triacrylate represented by the formula:

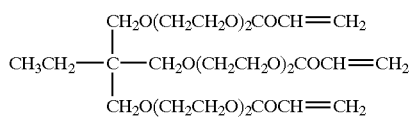

trimethylolpropane propyleneoxide triacrylate represented by the formula:

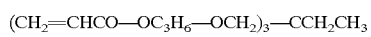

triacryloyloxyethyl phosphate, isocyanuric acid ethylene oxide triacrylate represented by the formula:

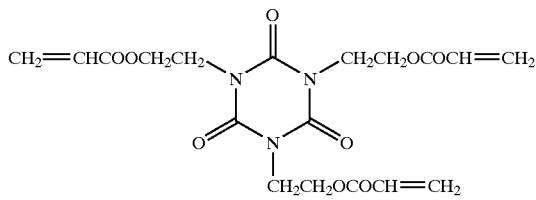

pentaerythritol tetraacrylate, dipentaerythritol pentaacrylate, dipentaerythritol hexaacrylate, and methacrylates corresponding to the above-mentioned acrylates.

Also, the present invention relates to the above-mentioned adhesive composition for a metal foil wherein the composition contains a polyvinyl acetal resin, a polyfunctional acrylate compound or a polyfunctional methacrylate compound having two or more acryloyl groups or methacryloyl groups in the molecule and an epoxy resin, said polyvinyl acetal resin comprises (a) an acetacetal portion, (b) a butylacetal portion, (c) a vinyl alcohol portion, (d) a vinyl acetate ester portion and (e) an itaconic acid portion having a carboxyl group as a side chain in the weight ratio of $0.1 \leq (e)/((a)+(b)+(c)+(d)+(e)) \leq 5$, and an average degree of polymerization (a number average degree of polymerization, hereinafter the same, which is determined by measuring, for example, a number average molecular weight of a polyvinyl acetate as a starting material utilizing a calibration curve of standard polystyrenes) of 1,000 to 3,000.

The present invention relates to the above-mentioned adhesive composition for a metal foil wherein the polyvinyl acetal resin comprises, in the weight ratio, $0.3 < (a)/((a)+(b))$ or $10 \leq (c)/((a)+(b)+(c)+(d)+(e)) \leq 20$.

The present invention relates to the above-mentioned adhesive composition for a metal foil which further comprises at least one filler selected from the group consisting of silica, alumina, aluminum hydroxide, magnesium hydroxide, talc and organic filler.

The present invention relates to the above-mentioned adhesive composition for a metal foil which further comprises at least one of an antioxidant, a metal scavenger or a lubricant.

Moreover, the present invention relates to an adhesive-coated metal foil which is obtained by coating the above-mentioned adhesive composition for a metal foil as a varnish on one of the surfaces of the metal foil and drying.

The present invention also relates to a metal-clad laminate obtained by laminating the adhesive layer side of the above-mentioned adhesive-coated metal foil on one surface or both surfaces of at least one sheet of a prepreg, and molding under heating and pressure.

The present invention further comprises a wiring board for forming a circuit on the metal surface of the above-mentioned metal-clad laminated board, a multi-layer board obtained by laminating the adhesive layer side of the above-mentioned adhesive-coated metal foil on the above wiring board as a circuit side and molding under heating and pressure, and a multi-layer wiring board which comprises forming a circuit on the metal surface of the multi-layer board.

DESCRIPTION OF THE PREFERRED EMBODIMENTS

In the following, the present invention is explained in detail.

The present invention relates to an adhesive composition for a metal foil which comprises a material wherein a tracking resistance test is carried out according to the IEC method by making a thickness of an adhesive layer 30 to 40 μm, using a copper foil pattern with a width of 4 mm and making a distance between electrodes 0.4 mm, then the adhesive layer dissolves out for the first time when 5 drops or more of an electrolyte are dropped thereon. When the above-mentioned tracking resistance test is carried out, if the adhesive layer dissolves out with less than 5 drops of the electrolyte, a prepreg layer under the adhesive layer is exposed. Tracking resistance of the prepreg layer is inferior to that of the adhesive layer so that good tracking resistance cannot be obtained when the adhesive layer dissolves out with less than 5 drops of the electrolyte. When the adhesive layer remains with 5 drops or more of electrolyte without dissolving out, then the adhesive layer maintain the level of the tracking resistance whereby higher tracking resistance can be obtained.

In the present invention, the adhesive composition for a metal foil preferably contains a polyvinyl acetal resin and a thermosetting resin.

As the thermosetting resin, an epoxy resin, a melamine resin, an isocyanate resin, a polyfunctional acrylate resin or a polyfunctional methacrylate resin having two or more acryloyl groups or methacryloyl groups in the molecule or the like is used.

The polyvinyl acetal resin to be used in the present invention is a polymer obtained by condensation of a polyvinyl alcohol and an aldehyde, and has an acetal bond in the molecule. When formaldehyde is used as an aldehyde, a polyvinyl formal resin can be obtained and butylaldehyde is used as an aldehyde, a polyvinyl butyral resin can be obtained. In the present invention, the polyvinyl butyral resin is preferred. The degree of polymerization and a butyral component of the polyvinyl butyral resin are not particularly limited but preferably those having an average degree of polymerization of 500 to 3,000 and the butyral component of 60 mol % or more. If the average polymerization degree is less than 500, heat resistance of the adhesive is not sufficient, while if it exceeds 3,000, the viscosity of the adhesive becomes too high so that coating on a metal foil tend to be difficult. An amount of the butyral component is not particularly limited so long as it is within the above-mentioned range, but if it is less than 60 mol %, flexibility of the resin is not sufficient so that adhesive strength tends to be inferior.

As the polyvinyl butyral resin, commercially available products such as S-LEC BX-1 (average degree of polymerization: 1700, butyral component: 65 mol %), S-LEC BX-2 (average degree of polymerization: 1700, butyral component: 65 mol %), S-LEC BX-55 (average degree of polymerization: 1700, butyral component: 70 mol %) (all trade names, available from Sekisui Chemical Co., Ltd., Japan), Denka Butyral #4000-2 (average degree of polymerization: 1000, 75% by weight, butyral component: 65 mol %), Denka Butyral #5000-A (average degree of polymerization: 2000, butyral component: 80% by weight, 70 mol %), Denka Butyral #6000-C (average degree of polymerization: 2400, butyral component: 80% by weight, 70 mol %) (all trade names, available from Denki Kagaku Kogyo K.K., Japan), and the like may be mentioned. These resins may be mentioned singly or in combination of two or more.

As the polyfunctional acrylate compound or the polyfunctional methacrylate compound having two or more acryloyl groups or methacryloyl groups in the molecule, there may be mentioned, for example, 1,4-butanediol diacrylate, 1,6-hexanediol diacrylate, 1,9-nonanediol diacrylate, neopentylglycol diacrylate, tetraethyleneglycol diacrylate, tripropyleneglycol diacrylate, polypropylene glycol diacrylate, ethylene glycol diacrylate, diethylene glycol diacrylate, triethylene glycol diacrylate, polyethylene glycol diacrylate, bisphenol A ethylene oxide-modified diacrylate, pentaerythritol triacrylate, trimethylolpropane triacrylate, trimethylolpropane ethylene oxide triacrylate (shown by the above formula), trimethylolpropane propylene oxide triacrylate (shown by the above formula), trisacryloyloxyethyl phosphate, isocyanuric acid ethylene oxide triacrylate (shown by the above formula), pentaerythritol tetraacrylate, dipentaerythritol pentaacrylate, dipentaerythritol hexaacrylate and methacrylates corresponding to the above-mentioned acrylates, and the like. Among these compounds, in the point of heat resistance of the cured product, preferred are those having three or more of acryloyl groups or methacryloyl groups in the molecule such as pentaerythritol triacrylate, trimethylolpropane triacrylate, trimethylolpropane ethylene oxide triacrylate, trimethylolpropane propylene oxide triacrylate, trisacryloyloxyethyl phosphate, isocyanuric acid ethylene oxide triacrylate, pentaerythritol tetraacrylate, dipentaerythritol pentaacrylate, dipentaerythritol hexaacrylate and methacrylates corresponding to the above-mentioned acrylates.

The epoxy resin to be used in the present invention is not particularly limited, and there may be used a bisphenol A type epoxy resin, a bisphenol AF type epoxy resin, a bisphenol type epoxy resin, a bisphenol S type epoxy resin, a bisphenol AD type epoxy resin, a phenol-novolak type epoxy resin, a cresol-novolak type epoxy resin, an aliphatic epoxy resin, an alicyclic epoxy resin, a glycidyl ester type epoxy resin, a glycidyl amine type epoxy resin, a heterocyclic epoxy resin, an epoxidized polybutadiene resin and the like. More specifically, commercially available products such as Epikote 815, 828, 1001, 1004 and 1007 (all trade names, available from Yuka Shell Epoxy K.K., Japan, bisphenol A type epoxy resins), Epikote 152 and 154 (all trade names, available from Yuka Shell Epoxy K.K., Japan, phenol-novolak type epoxy resins), Epikote 180S65 (trade name, available from Yuka Shell Epoxy K.K., Japan, cresol-novolak type epoxy resin), EX-611 and 612 (all trade names, available from Nagase Kasei Kogyo K.K., Japan, aliphatic epoxy resins), CY175, 177 and 179 (all trade names, available from Asahi Ciba K.K., Japan, alicyclic epoxy resins), Epikote 871 and 872 (all trade names, available from Yuka Shell Epoxy K.K., Japan, glycidyl ester type epoxy resins), TETRAD-X and TETRAD-C (all trade names, available from Mitsubishi Gas Chemical Co., Inc., Japan, glycidyl amine type epoxy resins), TEPIC (trade name, available from Nissan Chemical Industries, Ltd., Japan, heterocyclic epoxy resin), BF-1000 (trade name, available from ASAHI DENKA KOGYO K.K., Japan, epoxidized polybutadiene resin) and the like may be used. These epoxy resins may be used singly or in combination of two or more.

In the present invention, a curing agent for the polyfunctional acrylate compound or the polyfunctional methacrylate compound may be used, if necessary. The curing agent is not particularly limited and may be mentioned an organic peroxide, etc. Representative examples thereof may include methyl ethyl ketone peroxide, cyclohexanone peroxide, 1,1-bis(t-hexylperoxy)cyclohexanone, cumene hydroperoxide, dicumyl peroxide, t-butylcumyl peroxide, isobutyl peroxide, octanoyl peroxide, lauroyl peroxide, benzoyl peroxide, diisopropyl peroxydicarbonate, cumyl peroxyneodecanate and the like. An amount of the curing agent to be used is preferably 0.1 to 10% by weight based on the amount of the polyfunctional acrylate compound or the polyfunctional methacrylate compound.

Also, in the present invention, a curing agent or a curing accelerator for an epoxy resin may be used, if necessary. The kind and the amount of the curing agent are not particularly limited. The curing agent or the curing accelerator for an epoxy resin may include an amine series curing agent such as 4,4'-diaminodiphenylmethane, etc.; an imidazole series curing agent or curing accelerator such as 2-ethyl-4-methylimidazole, etc.; and a Lewis acid series curing agent such as $BF_3$ monoethylamine complex, etc. An amount of the curing agent to be used is preferably 0.5 to 2 equivalent, more preferably 1 equivalent or substantially 1 equivalent based on 1 equivalent of the epoxy group of the epoxy resin. An amount of the curing accelerator is preferably 0.1 to 10% by weight based on the amount of the epoxy resin.

The melamine resin to be used in the present invention is not particularly limited, and may be mentioned a methyl etherified melamine resin, a butyl etherified melamine resin, a mixed etherified melamine resin and the like. More specifically, commercially available products such as MS-11, MS-001, MW-30 and MX-705 (all trade names, available from Sanwa Chemical Co., Japan, methyl etherified melamine resins), Melan 220, Melan 245, Melan 280 and Melan 2000 (all trade names, available from Hitachi Chemical Co., Ltd., Japan, butyl etherified melamine resins), and MX-408 (trade name, available from Sanwa Chemical Co., Japan, mixed etherified melamine resins) may be used. These melamine resins may be used singly or in combination of two or more. Moreover, a curing agent for such melamine resins may be also used, if necessary. The kind and the amount of the curing agent are not particularly limited, but the amount thereof is preferably 0.1 to 10% by weight based on the amount of the melamine resin. The curing agent may include, for example, an acidic curing agent such as p-toluenesulfonic acid, adipic acid, itaconic acid, salicylic acid, oxalic acid, benzoic acid, acetic acid, etc., and an acid anhydride series curing agent such as maleic anhydride, phthalic anhydride, acetic anhydride, etc.

The isocyanate compound to be used in the present invention is not particularly limited, and preferably a block isocyanate in which an isocyanate is blocked with a compound having an active hydrogen in view of storage stability of the adhesive. The isocyanate may include hexamethylene diisocyanate, tolylene diisocyanate, diphenylmethane diisocyanate, isophorone diisocyanate, and the like, but it is not specifically limited to these so long as desired characteristics can be obtained. More specifically, commercially available block isocyanates such as CORONATE AP stable, CORONATE 2503, Millionate MS-50, CORONATE 2515, CORONATE 2517, CORONATE 2512, CORONATE 2507, CORONATE 2527, CORONATE 2513, CORONATE 2529 (all trade names, available from NIPPON POLYURETHANE INDUSTRY, CO., LTD., Japan) may be used.

In the present invention, the adhesive composition for a metal foil preferably comprises a polyvinyl acetal resin and a thermosetting resin, and in the thermogravimetric analysis after curing, a 5% weight loss temperature is 290° C. or more and a carbon residual ratio at 650° C. is less than 1% by weight.

The method for the thermogravimetric analysis is not particularly limited, and the method with a temperature-raising rate of 5° C./min to 10° C./min is generally used. The 5% weight loss temperature of the cured reaction product is required to be 290° C. or more. If it is less than 290° C., the desired high tracking property cannot be obtained. Moreover, the carbon residual ratio at 650° C. is required to be less than 1% by weight. If the carbon residual ratio is 1% by weight or more, the desired high tracking property cannot be obtained.

A formulation ratio of the polyvinyl acetal resin and the thermosetting resin is preferably the former/the latter of 25/100 to 600/100 (weight ratio).

Further, in the present invention, it is preferred that at least one of thermosetting resins does not react with a polyvinyl acetal resin and it is compatible with the as polyvinyl acetal resin uniformly. If the thermosetting resin reacts with the polyvinyl acetal resin, reaction form becomes complex and sufficient reactivity is tend to be difficultly obtained. Also, when the thermosetting resin and the polyvinyl acetal resin are not compatible uniformly, the composition of the cured product becomes ununiform and the heat resistance, etc. are tend to be lowered.

Moreover, in the present invention, it is preferred that at least one of thermosetting resins does not have an aromatic ring. When it has an aromatic ring, the carbon residual ratio at 650° C. tends to be easily 1% by weight or more and the tracking resistance is tend to be lowered.

In the present invention, it is preferred that at least one of the thermosetting heat-resistance resins is at least one of a polyfunctional acrylate resin or a polyfunctional methacrylate resin having at least 2 of an acryloyl group or a methacryloyl group in the molecule.

In the present invention, it is preferred that the above-mentioned adhesive composition for a metal foil comprises as main components a polyvinyl acetal resin, a polyfunctional acrylate compound or a polyfunctional methacrylate compound having two or more acryloyl groups or methacryloyl groups in the molecule and an epoxy resin.

The formulation ratio of the main components of the adhesive composition for a metal foil according to the present invention is preferably, based on 100 parts by weight of a polyvinyl acetal resin, 20 to 500 parts by weight of a polyfunctional acrylate resin or a polyfunctional methacrylate resin, and 5 to 100 parts by weight of an epoxy resin. If the formulation amount of the polyfunctional acrylate resin or the polyfunctional methacrylate resin is less than 20 parts by weight, curing of the resin tends to be insufficient whereby the heat resistance of the cured product tends to be low. If it exceeds 500 parts by weight, peeling strength of the metal foil tends to be lowered. If an amount of the epoxy resin is less than 5 parts by weight, metal peeling strength is lowered while if it exceeds 100 parts by weight, the resin after curing tends to become brittle. The amount of the epoxy resin is preferably within the range of 10 to 80 parts by weight.

Incidentally, in the present invention, a thermosetting resin such as a melamine resin, a polyester, a phenol resin, a polyurethane resin, an isocyanate resin and the like may be added to the above-mentioned adhesive composition for a metal foil within the range which does not impair the characteristics of the cured product.

The thermosetting resin other than the epoxy resin is preferably used in an amount of 20% by weight or less based on the total amount of the thermosetting resin such as the polyvinyl acetal resin, epoxy resin, etc. and the polyfunctional (meth)acrylate resin, and the melamine resin is preferably used in an amount of 3 to 20% by weight based on the same to avoid tackiness of the composition.

Also, in the present invention, it is preferred that the above-mentioned adhesive composition for a metal foil contains a polyvinyl acetal resin, a polyfunctional acrylate compound or a polyfunctional methacrylate compound having two or more acryloyl groups or methacryloyl groups in the molecule and an epoxy resin, said polyvinyl acetal resin comprises (a) an acetacetal portion, (b) a butylacetal portion, (c) a vinyl alcohol portion, (d) a vinyl acetate ester portion and (e) an itaconic acid portion having a carboxyl group as a side chain in the weight ratio of $$0.1 \leq (e)/((a)+(b)+(c)+(d)+(e)) \leq 5,$$

and an average degree of polymerization thereof is 1,000 to 3,000.

According to the above formulation, tracking resistance and solder heat resistance can be improved. If the formulation ratio is less than the above-mentioned range, heat resistance tends to be lowered, while if it exceeds the above range, solubility tends to be lowered. If the above-mentioned average degree of polymerization is less than 1,000, heat resistance tends to be lowered, while if it exceeds 3,000, the viscosity of the varnish becomes high so that it is disadvantageous to prepare a composition with a higher amount of resin.

When the polyvinyl acetal resin satisfies, in a weight ratio, $$0.3 < (a)/((a)+(b)) \text{ or}$$

$$10 \leq (c)/((a)+(b)+(c)+(d)+(e)) \leq 20,$$

tracking resistance, solder heat resistance and compatibility of the resins are more improved.

Also, in the present invention, it is preferred to formulate, as a filler, at least one selected from the group consisting of silica, alumina, aluminum hydroxide, magnesium hydroxide, talc and organic filler. The kind and the shape of the filler are not particularly limited, and aluminum hydroxide is preferred to give good tracking resistance. It is preferred to formulate, as an additive, at least one of an antioxidant, a metal scavenger or a lubricant. The antioxidant is not particularly limited, and is preferably at least one selected from the group consisting of a monophenol type, a bisphenol type, a trisphenol type, a polyphenol type and a hindered phenol type ones. If these antioxidants are not added, metal foil peeling strength or solder heat resistance may sometimes by lowered. Also, the metal scavenger is not particularly limited, and is preferably at least one selected from the group consisting of an oxine and its derivatives, a triazine thiol and its derivatives. By adding these compounds, further improvement in tracking resistance can be expected. Moreover, the lubricant is also not particularly limited, and is preferably at least one selected from the group consisting of a silicone compound and a fluorine compound. By adding these compounds, the step of preparing or using the adhesive-coated metal foil can be easily automated.

The adhesive composition for a metal foil of the present invention is dissolved in an organic solvent to produce a varnish and the varnish is coated on one side surface of the metal foil and dried to obtain an adhesive-coated metal foil. As the organic solvent, it is not particularly limited so long as it dissolves the above-mentioned material, and there may be mentioned, for example, an alcohol series solvent such as methanol, ethanol, isopropanol, n-butanol, etc; a ketone series solvent such as acetone, methyl ethyl ketone, cyclohexanone, etc.; an aromatic hydrocarbon solvent such as toluene, xylene, etc.; a sulfur compound series solvent such as dimethylsulfoxide, etc.; an amide series solvent such as N-methylpyrrolidone, formaldehyde, N-methylformaldehyde, N,N-dimethylformamide, etc.; a cellosolve series solvent such as methyl cellosolve, ethyl cellosolve, and cellosolve acetate, and the like.

The metal foil to be used for preparing the adhesive-coated metal foil according to the present invention is not particularly limited, and any metal foil usually used for a laminated plate such as a copper foil, an aluminum foil, etc. having a thickness of 5 to 200 μm may be used. Also, a three-layered structure composite foil comprising an intermediate layer such as nickel, nickel-phosphor, a nickel-tin alloy, a nickel-iron alloy, lead, a lead-tin alloy, etc. being interposed between a copper layer having a thickness of 0.5 to 15 μm and a copper layer having a thickness of 10 to 300 μm, or a composite foil in which an aluminum foil and a copper foil are laminated may be used.

The adhesive-coated metal foil according to the present invention can be obtained by coating the above-mentioned varnish on the one surface of the metal foil and drying. An amount of the adhesive to be coated on the metal foil is not particularly limited and it is preferred to make the thickness of the adhesive layer after drying 10 to 200 μm.

If the thickness of the adhesive layer is less than 10 μm, metal peeling strength is lowered while if it exceeds 200 μm, an amount of the remaining non-volatile component becomes large whereby heat resistance tends to be lowered. The thickness of the adhesive layer is preferably 20 to 100 μm, more preferably 25 to 80 μm.

For heating and drying means, hot air drying, far infrared drying, etc. may be used, and it is not particularly limited. Also, the drying temperature and the drying time are not particularly limited, and they are preferably in the range of 40 to 250° C. with the drying time of 10 seconds to 20 minutes. The residual non-volatile component of the adhesive layer is preferably 10% by weight or less.

The metal-clad laminate of the present invention can be produced by coating the varnish of the above-mentioned adhesive composition for a metal foil on the one surface of the metal foil and drying to prepare an adhesive-coated metal foil, laminating the adhesive surface of the adhesive-coated metal foil to one surface or both surfaces of a core material or a prepreg at least one of which is laminated, and molding the resulting material under vacuum or a normal pressure and under heating and pressure. Molding is carried out at the heating temperature preferably within the range of 80 to 200° C. and the pressure generally within the range of 1 to 15 MPa for 30 to 180 minutes.

The adhesive-coated metal foil of the present invention can be used as a material for multi-layer of the so-called build-up method in which the foil is laminated to an inner layer plate by the heat press method or the heat roll laminate method when a thin multi-layer wiring board is to be produced.

As the base material for the prepreg to be used for producing the metal-clad laminate of the present invention, paper, a glass cloth, an aramid cloth and non-woven fabric thereof may be used. As the thermosetting resin to be used as a matrix of the prepreg, a phenol resin, an epoxy resin, a polyimide resin, an unsaturated polyester resin, etc. may be used.

A wiring board can be produced by printing an electric circuit on the metal surface of the metal-clad laminate by using a resist ink or a resist film, and removing the metal at the portion of no resist by etching to form a wiring board.

The adhesive layer of the adhesive-coated metal foil of the present invention is adhered onto the circuit side(s) of the one surface or both surfaces of the wiring board obtained as mentioned above or the conventional wiring board, and molding the resulting material under vacuum or under normal pressure and under heating and pressure, whereby a multi-layer board can be produced. Also, a highly multi-layered multi-layer plate can be produced by subjecting the surface of the above-mentioned multi-layer board to circuit fabrication, laminating the adhesive-coated metal foil in the same manner, and molding under heating and pressure, and repeating these procedure.

Moreover, a multi-layer wiring board can be produced by forming a circuit on the metal surface of the multi-layer board according to the conventional manner.

EXAMPLES

In the following, the present invention will be explained by referring to Examples but the present invention is not limited by these Examples. In the following Examples, "part" means "part by weight", and "I" means "% by weight".

Examples 1 and 2

Resins formulated as shown in Table 1 (the unit is a part by weight, hereinafter the same in Examples and Comparative examples) were uniformly dissolved in a mixed solvent of methanol-methyl ethyl ketone (1/1 weight ratio) and the solid component of the resulting material was regulated to as 30% to obtain a varnish of an adhesive composition for metal foil. This varnish was coated on one surface of a copper foil having a thickness of 35 μm by a roll coater and thermally dried and cured at 160° C. for 5 minutes to obtain an adhesive-coated copper foil with the adhesive layer thickness of 40 μm. On the adhesive side of the above copper foil were placed 8 sheets of phenol resin-impregnated paper base materials (B stage (semi-cured at 150° C. for 5 minutes) tung oil-modified phenol resin-impregnated craft paper, in the following Examples, the same material was used) to prepare a laminate, and the resulting material was sandwiched between stainless mirror plates and molded under heating at 160° C., at a pressure of 10 MPa for 60 minutes to obtain a copper-clad laminate. The characteristics of this copper-clad laminate were shown in Table 1.

The tung oil-modified phenol resin used for the impregnated paper base material was prepared as mentioned below.

A mixture comprising 1,500 g of phenol, 1,000 g of tung oil and 3 g of p-toluenesulfonic acid were reacted at 90° C. for 3 hours, then, 800 g of a 80% paraformaldehyde and 50 g of a 25% aqueous ammonia were added thereto, and the mixture was reacted at 75° C. for 3 hours. Next, the reaction mixture was concentrated under reduced pressure at 80° C., the condensed water was removed and the point when the gel time at 160° C. became 150 seconds was made a final point. The resulting material was diluted by a mixed solvent (toluene-methanol (1/1 weight ratio)) to prepare a tung oil-modified phenol resin varnish having a resin content of 50%.

Comparative Examples 1 and 2

In the same manner as in Example 1 except for changing the materials to be used as shown in Table 1, varnish samples as shown in Table 1 were prepared and their properties were also measured in the same manner as in Examples.

TABLE 1

| Item | Examples 1 | Examples 2 | Comparative examples 1 | Comparative examples 2 |
|---|---|---|---|---|
| S-LEC BX-1 | 100 | 100 | 100 | 100 |
| Epikote 180S65 | 40 | 40 | 30 | 30 |
| Melan 2000 | — | 20 | 70 | — |
| VP-13N | — | — | — | 70 |
| Pentaerythritol tetraacrylate | 80 | 80 | 40 | — |
| Dicumyl peroxide | 0.8 | 0.8 | — | — |
| Benzoic acid | — | — | 0.7 | — |
| Number of drops until adhesive layer dissolved out (drops, 200 V) | 15 | 14 | 3 | 1 (tracking resistance breakage) |
| 5% weight loss temperature (° C.) of cured adhesive | 310 | 295 | 275 | 300 |
| Carbon residual ratio (%) of cured adhesive at 650° C. | 0.5 | 0.6 | 0.7 | 3.5 |
| Solder heat resistance (sec) | 51 | 55 | 48 | 40 |
| Copper foil peeling strength (kN/m) | 1.9 | 1.8 | 1.8 | 1.9 |
| High temperature (150° C.) | 0.6 | 0.7 | 0.5 | 0.6 |
| Tracking resistance (V) | 260 or more | 260 or more | 200 | 110 |

S-LEC BX-1: trade name, available from Sekisui Chemical Co., Ltd., polyvinyl acetal resin, average degree of polymerization: 1700, butyral component: 65 mol %.

Epikote 180S65: trade name, available from Yuka Shell Epoxy K.K., cresol-novolak type epoxy resin.

Melan 2000: trade name, available from Hitachi Chemical Co., Ltd., n-butylated melamine resin.

VP-13N: trade name, available from Hitachi Chemical Co., Ltd., resol type phenol resin.

Solder heat resistance and copper foil peeling strength were measured according to JIS C6481. Tracking resistance was measured according to the IEC method by using a platinum electrode with a copper foil pattern of 4 mm width pattern and the distance between the electrodes of in 0.4 mm (hereinafter the same).

As can be seen from the above Table 1, in the results of each Example, solder heat resistance is good, tracking resistance is excellent and lowering in other characteristics are not observed as compared with those of the comparative examples.

Examples 3 to 6

Resins formulated as shown in Table 2 were uniformly dissolved in a mixed solvent of methanol-methyl ethyl ketone (1/1 weight ratio) and the solid component of the resulting material was regulated to as 30% to obtain a varnish of an adhesive composition for metal foil. This varnish was coated on one surface of a copper foil having a thickness of 35 μm by a roll coater and thermally dried and cured at 160° C. for 5 minutes to obtain an adhesive-coated copper foil with the adhesive layer thickness of 40 μm. On the adhesive side of the above copper foil were placed 8 sheets of phenol resin-impregnated paper base materials to prepare a laminate, and the resulting material was sandwiched between stainless mirror plates and molded under heating at 160° C., at a pressure of 10 MPa for 60 minutes to obtain a copper-clad laminate. The characteristics of this copper-clad laminate were shown in Table 2.

Comparative Examples 3 and 4

In the same manner as in Example 3 except for changing the materials to be used as shown in Table 2, varnish samples as shown in Table 2 were prepared and their properties were also measured in the same manner as in Examples.

TABLE 2

| Item | Examples 3 | Examples 4 | Examples 5 | Examples 6 | Comparative examples 3 | Comparative examples 4 |
|---|---|---|---|---|---|---|
| S-LEC BX-1 | 100 | 100 | 100 | 100 | 100 | 100 |
| Epikote 180S65 | 40 | 40 | 40 | 40 | 30 | 30 |
| Melan 2000 | — | 20 | — | — | 70 | — |
| VP-13N | — | — | — | — | — | 70 |
| Pentaerythritol tetraacrylate | 80 | 80 | 80 | 80 | — | — |
| CORONATE 2515 | — | — | 20 | — | — | — |
| Aluminum hydroxide | — | — | — | 100 | — | — |
| Dicumyl peroxide | 0.8 | 0.8 | 0.8 | 0.8 | — | — |
| Benzoic acid | — | — | — | — | 0.7 | — |
| Number of drops until adhesive layer dissolved out (drops, 200 V) | 15 | 14 | 14 | 17 | 3 | 1 |
| 5% weight loss temperature (° C.) of cured adhesive | 310 | 295 | 305 | 310 | 260 | 300 |
| Carbon residual ratio (%) of cured adhesive at 650° C. | 0.5 | 0.8 | 0.6 | 0.5 | 0.9 | 3.5 |
| Solder heat resistance (sec) | 51 | 55 | 48 | 50 | 35 | 40 |
| Copper foil peeling strength (kN/m) | 1.9 | 1.8 | 1.8 | 1.9 | 1.9 | 1.9 |
| High temperature (150° C.) | 0.6 | 0.7 | 0.8 | 1.0 | 0.4 | 0.6 |
| Tracking resistance (V) | 260 or more | 260 or more | 260 or more | 260 or more | 200 | 110 |

S-LEC BX-1: trade name, available from Sekisui Chemical Co., Ltd., polyvinyl acetal resin, average degree of polymerization: 1700, butyral component: 65 mol %.

Epikote 180S65: trade name, available from Yuka Shell Epoxy K.K., cresol-novolak type epoxy resin.

Melan 2000: trade name, available from Hitachi Chemical Co., Ltd., n-butylated melamine resin.

VP-13N: trade name, available from Hitachi Chemical Co., Ltd., resol type phenol resin.

CORONATE 2515: trade name, available from NIPPON POLYURETHANE INDUSTRY, CO., LTD., block isocyanate.

As can be seen from the above Table 2, in the results of each Example, solder heat resistance is good, tracking resistance is excellent and lowering in other characteristics are not observed as compared with those of the comparative examples.

Examples 7 to 9

Resins formulated as shown in Table 3 were uniformly dissolved in a mixed solvent of methanol-methyl ethyl ketone (1/1 weight ratio) and the solid component of the resulting material was regulated to as 30% to obtain a varnish of an adhesive composition for metal foil. This varnish was coated on one surface of a copper foil having a thickness of 35 μm by a roll coater and thermally dried and cured at 160° C. for 5 minutes to obtain an adhesive-adhered copper foil with the adhesive layer thickness of 40 μm. On the adhesive side of the above copper foil were placed 8 sheets of phenol resin-impregnated paper base materials to prepare a laminate, and the resulting material was sandwiched between stainless mirror plates and molded under heating at 160° C., at a pressure of 10 MPa for 60 minutes to obtain a copper-clad laminate. The characteristics of this copper-clad laminate were shown in Table 3.

Comparative Examples 5 and 6

In the same manner as in Example 7 except for changing the materials to be used as shown in Table 3, varnish samples as shown in Table 3 were prepared and their properties were also measured in the same manner as in Examples.

TABLE 3

| Item | Examples | | | Comparative examples | |
|---|---|---|---|---|---|
| | 7 | 8 | 9 | 5 | 6 |
| Denka Butyral #5000-A | 100 | 100 | 100 | 100 | 100 |
| Epikote 180S65 | 20 | 50 | 80 | 30 | 30 |
| Melan 2000 | — | — | — | 70 | — |
| VP-13N | — | — | — | — | 70 |
| Pentaerythritol triacrylate | 80 | — | — | — | — |
| Isocyanuric acid ethyleneoxide-modified triacrylate | — | 100 | — | — | — |
| Dipentaerythritol pentaacrylate | — | — | 450 | — | — |
| Dicumyl peroxide | 0.5 | 1.0 | 4.5 | — | — |
| Benzoic acid | — | — | — | 0.7 | — |
| Number of drops until adhesive layer dissolved out (drops, 200 V) | 14 | 15 | 15 | 3 | 1 |
| Solder heat resistance (sec) | 51 | 55 | 60 | 35 | 39 |
| Copper foil peeling strength (kN/m) | 1.9 | 1.8 | 1.8 | 1.9 | 1.9 |
| High temperature (150° C.) | 0.6 | 0.7 | 0.8 | 0.4 | 0.6 |
| Tracking resistance (V) | 260 or more | 260 or more | 260 or more | 200 | 110 |

Denka Butyral #5000-A: trade name, available from Denki Kagaku Kogyo K.K., polyvinyl acetal resin, average degree of polymerization: 2000, butyral component: 70 mol %.

Epikote 180S65: trade name, available from Yuka Shell Epoxy K.K., cresol-novolak type epoxy resin.

Melan 2000: trade name, available from Hitachi Chemical Co., Ltd., n-butylated melamine resin.

VP-13N: trade name, available from Hitachi Chemical Co., Ltd., resol type phenol resin.

As can be seen from the above Table 3, in the results of each Example, solder heat resistance is good, tracking resistance is excellent and lowering in other characteristics are not observed as compared with those of the comparative examples.

Examples 10 and 11

To 100 parts of a polyvinyl acetal resin (S-LEC KS-31Z, trade name, available from Sekisui Chemical Co., Ltd.), 70 parts of pentaerythritol triacrylate as a polyfunctional acrylate resin, 30 parts of a cresol-novolak type epoxy resin (Epikote 180S65, trade name, available from Yuka 'i' Shell Epoxy K.K.) as an epoxy resin, 3 parts of dicumyl peroxide, 3 parts of pyrrogalol as an antioxidant, 1 part of dibutylaminotriazine dithiol as a metal scavenger and 0.5 part of BYK-333 (trade name, a silicon series compound, available from Big Chemie Japan) as a lubricant were formulated. These materials were uniformly dissolved in a mixed solvent of methanol-methyl ethyl ketone (1/1 weight ratio) and the solid component of the resulting material was regulated to as 30% to obtain a varnish. This varnish was coated on one surface of a copper foil having a thickness of 35 μm by a roll coater and thermally dried and cured at 160° C. for 5 minutes to obtain an adhesive-coated copper foil with the adhesive layer thickness of 40 μm. On the adhesive side of the above copper foil were placed 8 sheets of phenol resin-impregnated paper base materials to prepare a laminate, and the resulting material was sandwiched between stainless mirror plates and molded under heating at 160° C., at a pressure of 10 MPa for 60 minutes to obtain a copper-clad laminate. The characteristics of this copper-clad laminate were shown in Table 4.

TABLE 4

| Item | Examples | |
|---|---|---|
| | 10 | 11 |
| Acetal portion (weight %) | 72 | 72 |
| (a) Acetacetal portion (weight %) | 40 | 80 |
| (b) Vinyl alcohol portion (weight %) | 13 | 13 |
| (c) Acetic acid vinyl ester portion (weight %) | 15 | 15 |
| (d) Acid portion of side chain (weight %) | 1 | 1 |
| Kind of acid at side chain | Itaconic acid | Itaconic acid |
| Number average degree of polymerization | 1500 | 2000 |
| Number of drops until adhesive layer dissolved out (drops, 200 V) | 14 | 14 |
| Solder heat resistance (sec) | 40 | 43 |
| Copper foil peeling strength (kN/m) | 2.1 | 2.1 |
| High temperature (150° C.) | 0.6 | 0.7 |
| Tracking resistance (V) | 260 or more | 260 or more |

As can be seen from the above Table 4, in the results of each Example, solder heat resistance is good, tracking resistance is excellent and lowering in other characteristics are not observed.

In the adhesive-coated metal foil, the metal-clad laminate, the wiring board, the multi-layer board and the multi-layer wiring board using the adhesive composition for a metal foil of the present invention, solder heat resistance is good, tracking resistance is excellent and lowering in other characteristics are not observed so that their industrial values are extremely large.

What is claimed is:

1. An adhesive composition for a metal foil which comprises as main components a polyvinyl acetal resin, a polyfunctional acrylate compound or a polyfunctional methacrylate compound having two or more acryloyl groups or methacryloyl groups in the molecule and an epoxy resin, wherein said polyvinyl acetal resin comprises (a) an acetoacetal portion, (b) a butylacetal portion, (c) a vinyl alcohol portion, (d) a vinyl acetate ester portion and (e) an itaconic acid portion having a carboxyl group as a side chain in the weight ratio of $$0.1 \leq (e)/((a)+(b)+(c)+(d)+(e)) \leq 5,$$

and a number average degree of polymerization of 1,000 to 3,000.

2. The adhesive composition for a metal foil according to claim 1, wherein said composition comprises 20 to 500 parts by weight of a polyfunctional acrylate compound or a polyfunctional methacrylate compound having two or more acryloyl groups or methacryloyl groups in the molecule and 5 to 100 parts by weight of an epoxy resin based on 100 parts by weight of the polyvinyl acetal resin.

3. The adhesive composition for a metal foil according to claim 1, wherein the polyfunctional acrylate compound or the polyfunctional methacrylate compound having two or more acryloyl groups or methacryloyl groups in the molecule is at least one selected from the group consisting of pentaerythritol triacrylate, trimethylolpropane triacrylate, trimethylolpropane ethyleneoxide-modified triacrylate, trimethylolpropane propyleneoxide-modified triacrylate, isocyanuric acid ethylene oxide-modified triacrylate, pentaerythritol tetraacrylate, dipentaerythritol pentaacrylate, dipentaerythritol hexaacrylate, and methacrylates corresponding to the above-mentioned acrylates.

4. The adhesive composition for a metal foil according to claim 1, wherein the polyvinyl acetal resin comprises, in the weight ratio, $0.3 < (a)/((a)+(b))$ or $10 \leq (c)/((a)+(b)+(c)+(d)+(e)) \leq 20$.

5. The adhesive composition for a metal foil according to any one of claims 1–3 or 4, wherein said composition further comprises at least one filler selected from the group consisting of silica, alumina, aluminum hydroxide, magnesium hydroxide, talc and organic filler.

6. The adhesive composition for a metal foil according to any one of claim 1–3 or 4, wherein said composition further comprises at least one of an antioxidant, a metal scavenger and a lubricant.

7. An adhesive-coated metal foil which is obtained by coating the adhesive composition for a metal foil according to any one of claims 1–3 or 4, as a varnish on one of the surfaces of the metal foil and drying.

8. The adhesive composition for a metal foil according to claim 1, further comprising a curing agent for the polyfunctional acrylate compound or the polyfunctional methacrylate compound.

* * * * *